(12) United States Patent
Lee et al.

(10) Patent No.: US 7,217,586 B2
(45) Date of Patent: May 15, 2007

(54) THIN FILM TRANSISTOR ARRAY SUBSTRATE AND METHOD OF FABRICATING THE SAME

(75) Inventors: Kyoung Mook Lee, Seoul (KR); Seung Hee Nam, Kyounggi-do (KR); Jae Young Oh, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 73 days.

(21) Appl. No.: 10/833,185

(22) Filed: Apr. 28, 2004

(65) Prior Publication Data

US 2004/0222421 A1 Nov. 11, 2004

(30) Foreign Application Priority Data

May 6, 2003 (KR) ...................... 10-2003-0028642

(51) Int. Cl.
*H01L 51/40* (2006.01)
(52) U.S. Cl. .......................................... 438/34; 349/46
(58) Field of Classification Search ................. 257/59, 257/72; 438/30, 34, 151; 349/46
See application file for complete search history.

(56) References Cited

U.S. PATENT DOCUMENTS

| | | | |
|---|---|---|---|
| 5,847,780 A | 12/1998 | Kim et al. | |
| 6,197,625 B1 * | 3/2001 | Choi | ........................... 438/158 |
| 6,338,989 B1 | 1/2002 | Ahn et al. | |
| 6,506,617 B1 | 1/2003 | Cheng | |
| 6,674,093 B1 * | 1/2004 | Tanaka et al. | ................. 257/72 |
| 2002/0171781 A1 | 11/2002 | Kim | |
| 2005/0170592 A1 * | 8/2005 | Baek et al. | ................. 438/294 |

FOREIGN PATENT DOCUMENTS

| | | |
|---|---|---|
| GB | 2 307 087 | 5/1997 |
| JP | 2001-005038 | 12/2001 |
| KR | 1999-00709262 | 11/1999 |
| KR | 2000-59689 | 5/2000 |
| KR | 2001-45360 | 5/2001 |
| WO | WO 03/014819 | 2/2003 |

* cited by examiner

*Primary Examiner*—Sara Crane
(74) *Attorney, Agent, or Firm*—Morgan, Lewis & Bockius LLP

(57) ABSTRACT

A thin film transistor array substrate includes a gate line formed on a substrate, a data line formed on the substrate intersecting with the gate line to define a pixel region, a thin film transistor formed at the intersection of the gate line and the data line, the thin film transistor including gate electrode formed on the substrate, a gate insulating layer formed on the gate electrode and the substrate, a semiconductor layer formed on the gate insulating layer, an ohmic contact layer on the semiconductor layer, and a source electrode and a drain electrode on the ohmic contact layer, and a transparent electrode material within the pixel region and connected to the drain electrode of the thin film transistor, wherein the gate insulating layer includes a gate insulating pattern underlying the data line and the transparent electrode material, and covering the gate line.

15 Claims, 32 Drawing Sheets

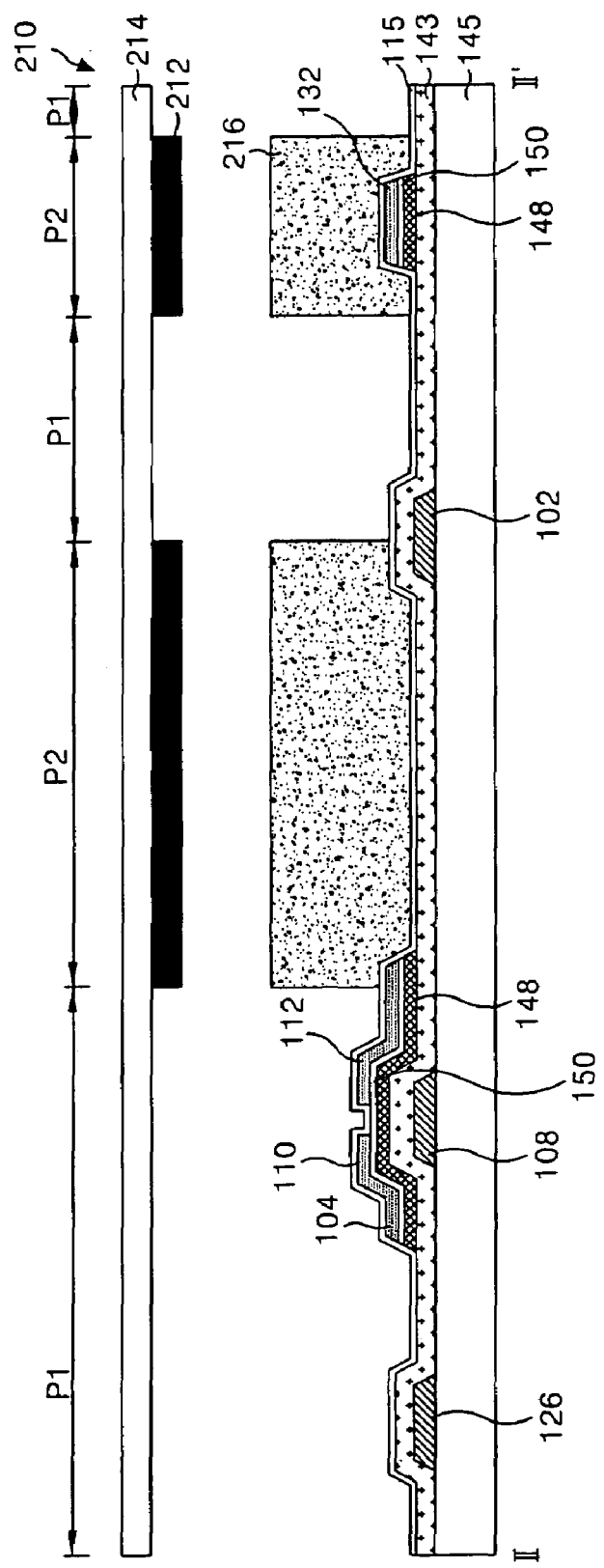

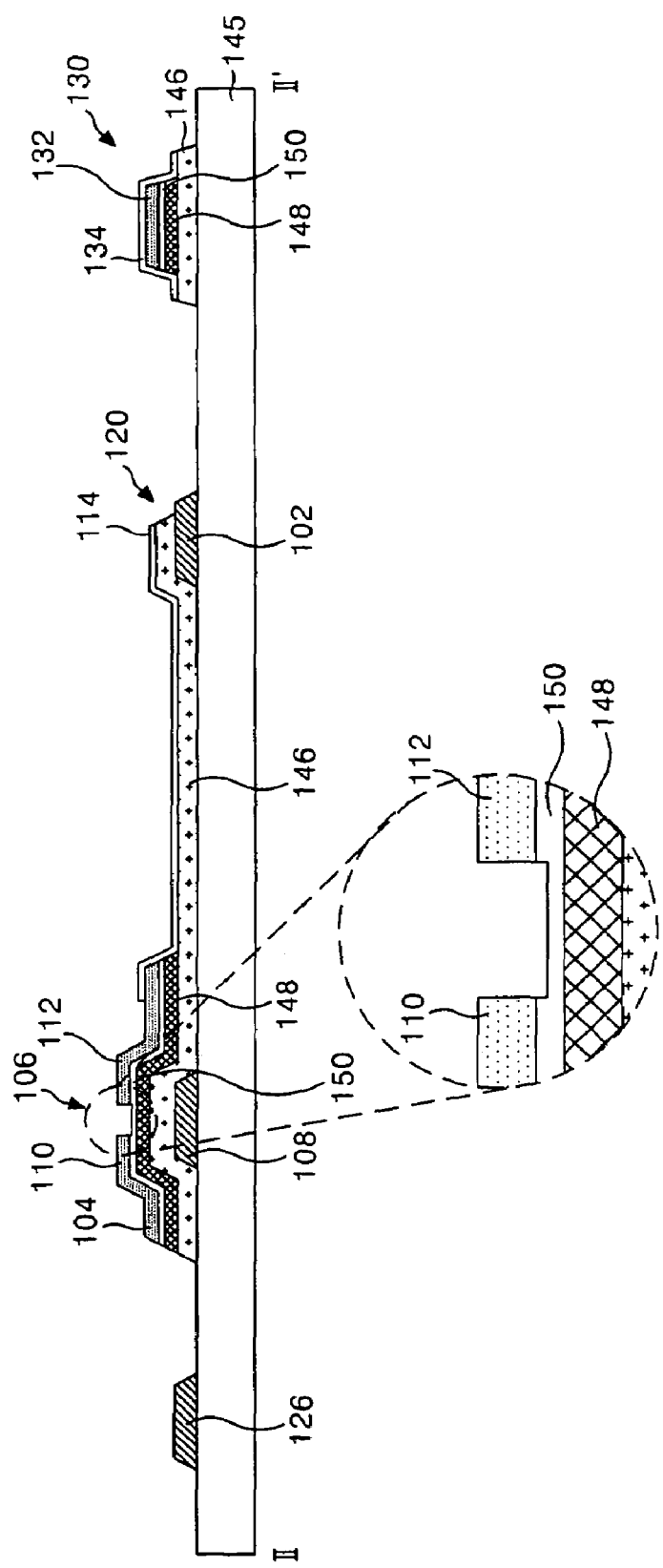

THIN FILM TRANSISTOR ARRAY SUBSTRATE AND METHOD OF FABRICATING THE SAME

The present application claims the benefit of Korean Patent Application No. P2003-28642 filed in Korea on May 6, 2003, which is hereby incorporated by reference.

BACKGROUND OF THE INVENTION

1. Field of the Invention

The present invention relates to an array substrate and method of fabricating an array substrate, and more particularly, to a thin film transistor array substrate and a method of fabricating a thin film transistor array substrate.

2. Description of the Related Art

In general, liquid crystal display (LCD) devices control light transmittance of liquid crystal material using an induced electric field to display images. The LCD device includes a common electrode formed on an upper substrate and a pixel electrode formed on a lower substrate, wherein the light transmittance of the liquid crystal material is controlled by the induced electric field formed between the common electrode and the pixel electrode. The LCD device comprises a thin film transistor (TFT) array substrate (a lower substrate) and a color filter array substrate (an upper substrate) attached together to face each other. In addition, a spacer is provided between the lower and upper substrates to provide a uniform cell gap therebetween, and the liquid crystal material is injected into the cell gap provided by the spacer. The TFT array substrate includes a plurality of signal lines, a plurality of thin film transistors, and an alignment film for providing liquid crystal alignment. The color filter array substrate includes a color filter for producing colored light, a black matrix for preventing light leakage, and an alignment film for providing liquid crystal alignment.

Since fabrication of the TFT array substrate involves semiconductor fabricating processes including a plurality of mask processes, the fabrication process is both complicated and costly. In order to solve this problem, the TFT array substrate has been developed having a reduced number of mask processes. Accordingly, because a single mask process includes individual sub-processes, such as thin film deposition, cleaning, photolithography, etching, photo-resist stripping, and inspection processes, a four-round mask process has been developed.

FIG. 1 is a plan view of a thin film transistor array substrate according to the FIG. 1 is a plan view illustrating a related art thin film transistor array substrate using the four-round mask process, and FIG. 2 is a cross sectional view along I–I' of FIG. 1 according to the related art. In FIGS. 1 and 2, a TFT array substrate comprises a gate line 2 and a data line 4, which have a gate insulating film 46 therebetween, formed to intersect on a lower substrate 45. In addition, a TFT 6 is formed at each intersection of the gate and data lines 2 and 4, a pixel electrode 14 is formed in a pixel region defined by the intersection of the gate and data lines 2 and 4, a storage capacitor 20 is formed at an overlapped portion between the gate line 2 and a storage electrode 22, a gate pad 24 is connected to the gate line 2, and a data pad 30 is connected to the data line 4.

The TFT 6 responds to gate signals transmitted along the gate line 2 such that pixel signals transmitted along the data line 4 are charged to the pixel electrode 14. Accordingly, the TFT 6 comprises a gate electrode 8 connected to the gate line 2, a source electrode 10 connected to the data line 4, and a drain electrode 12 connected to the pixel electrode 14. Furthermore, the TFT 6 includes an active layer 48 overlapping the gate electrode 8 with a gate insulating film 46 positioned between the TFT 6 and the gate electrode 8, thereby defining a channel between the source electrode 10 and the drain electrode 12. In addition, the data line 4, a lower data pad electrode 32, and the storage electrode 22 each overlie the active layer 48, wherein an ohmic contact layer 50 is formed on the active layer 48 for making ohmic contact with the data line 4, and the source electrode 10, the drain electrode 12, the lower data pad electrode 32, and the storage electrode 22 are formed on the ohmic contact layer 50. The pixel electrode 14, which is connected to the drain electrode 12 of the TFT 6 via a first contact hole 13 passing through a passivation film 52, is formed within the pixel region 5.

In FIGS. 1 and 2, an electric field is formed between the pixel electrode 14, which receives the pixel signals via the TFT 6, and a common electrode, which receives reference voltages. Accordingly, liquid crystal molecules of the liquid crystal material (not shown) arranged between the TFT array substrate and the color filter array substrate rotate due to dielectric anisotropy. Thus, the light transmittance within the pixel region 5 differs in accordance with a rotation amount of the liquid crystal molecules, thereby producing images.

In FIG. 2, the storage capacitor 20 consists of a storage electrode 22, which overlaps the gate line 2 with the gate insulating film 46, the active layer 48, and the ohmic contact layer 50 positioned therebetween, and a pixel electrode 14 connected via a second contact hole 21 passing through the storage electrode 22 and the passivation film 52. Accordingly, the storage capacitor 20 allows a pixel signal transmitted to the pixel electrode 14 to be stably maintained until a next pixel signal is transmitted to the pixel electrode 14.

In FIG. 2, the gate pad 24 consists of a gate pad lower electrode 26 extending from the gate line 2, and a gate pad upper electrode 28 connected, via a third contact hole 27 passing through the gate insulating film 46 and the passivation film 52, to the gate pad lower electrode 26. Although not shown, the gate pad 24 is connected to a gate driver and supplies gate signals to the gate line 2.

In FIG. 2, the data pad 30 consists of a lower data pad electrode 32 extending from the data line 4, and an upper data pad electrode 34 connected, via a fourth contact hole 33 passing through the passivation film 52, to the lower data pad electrode 32. Although not shown, the data pad 30 is connected to a data driver and supplies data signals to the data line 2.

FIGS. 3A to 3D are cross sectional views of a method of fabricating the thin film transistor array substrate of FIG. 2 according to the related art. In FIG. 3A, a first conductive pattern group including the gate line 2, the gate electrode 8, and the gate pad lower electrode 26 is formed on the lower substrate 45 using a first mask process. For example, a gate metal layer is formed on the upper substrate 45 by a deposition technique, such as sputtering, to form a double gate metal layer including aluminum. Then, the gate metal layer is patterned by photolithographic and etching processes using a first mask to form the first conductive pattern group including the gate line 2, the gate electrode 8, and the gate pad lower electrode 26.

In FIG. 3B, the gate insulating film 46 is formed on the lower substrate 45 provided with the first conductive pattern group. Then, a semiconductor pattern group including the active layer 48 and the ohmic contact layer 50 and a second conductive pattern group including the data line 4, the source electrode 10, the drain electrode 12, the lower data pad electrode 32, and the storage electrode 22 are formed on the gate insulating film 46 using a second mask process. For example, the gate insulating film 46, an amorphous silicon layer, a n+ amorphous silicon layer, and a source/drain metal layer are sequentially formed on the lower substrate 45 provided with the first conductive pattern group by deposition techniques, such as plasma enhanced chemical vapor deposition (PECVD) and sputtering. The gate insulating film 46 is made of an inorganic insulating material, such as silicon oxide ($SiO_x$) or silicon nitride ($SiN_x$), and the source/drain metal layer is made of a molybdenum (Mo), a titanium (Ti), tantalum (Ta), or a molybdenum alloy.

Then, a photo-resist pattern is formed on the source/drain metal layer by photolithographic processes using a second mask. Accordingly, a diffractive exposure mask having a diffractive exposure portion corresponding to a channel region of the TFT is used as a second mask. Thus, a photo-resist pattern of the channel portion has a lower height than other photo-resist patterns corresponding to other regions. Subsequently, the source/drain metal layer is patterned by a wet etching process using the other photo-resist patterns to provide a second conductive pattern group including the data line 4, the source electrode 10, the drain electrode 12, which is integral to the source electrode 10, and the storage electrode 22. Next, the amorphous silicon layer and the n+ amorphous silicon layer are simultaneously patterned by a dry etching process using the same photo-resist pattern to provide the ohmic contact layer 50 and the active layer 48.

Then, relatively low height portions of the photo-resist pattern are removed from the channel region by an ashing process, and the source electrode, the source/drain metal pattern, and the ohmic contact layer 50 of the channel region are etched using the dry etching process. Thus, the active layer 48 of the channel region is exposed to electrically separate the source electrode 10 from the drain electrode 12. Next, remaining portions of the photo-resist pattern on the second conductive pattern group are removed using a stripping process.

In FIG. 3C, the passivation film 52 including first, second, third, and fourth contact holes 13, 21, 27, and 33 are formed on the gate insulating film 46 provided with the second conductive pattern group using a third mask process. For example, the passivation film 52 is entirely formed on the gate insulating film 46 provided with the second conductive pattern group by a deposition technique, such as PECVD. Then, the passivation film 52 is patterned by photolithographic and etching processes using the third mask to form the first, second, third, and fourth contact holes 13, 21, 27, and 33. The first contact hole 13 is formed to pass through the passivation film 52 and expose a portion of the drain electrode 12, and the second contact hole 21 is formed to pass through the passivation film 52 and expose a portion of the storage electrode 22. The third contact hole 27 is formed to pass through the passivation film 52 and the gate insulating film 46 and expose a portion of the gate pad lower electrode 26, and the fourth contact hole 33 is formed to pass through the passsivation film 52 and expose a portion of the lower data pad electrode 32. When a metal having a high ratio of dry etching, such as molybdenum (Mo), is used for the source/drain metal, the first contact hole 13, the second contact hole 21, and the fourth contact hole 33 are formed to pass through to the exposed portions of the drain electrode 12, the storage electrode 22, and the lower data pad electrode 32, respectively. In addition, the passivaion film 52 is made of an inorganic insulating material, such as the gate insulating film 46, or made of an organic insulating material having a small dielectric constant, such as an acrylic organic compound, benzocyclobutene (BCB) or perfluorocyclobutane (PFCB).

In FIG. 3D, a third conductive pattern group including the pixel electrode 14, the gate pad upper electrode 28, and the upper data pad electrode 34 is formed on the passivation film 52 using a fourth mask process. For example, a transparent conductive film is coated onto the passivation film 52 by a deposition technique, such as sputtering, and is patterned by photolithographic and etching processes using a fourth mask. The transparent conductive film may be made of indium-tin-oxide (ITO), tin-oxide (TO), indium-zinc-oxide (IZO), or indium-tin-zinc-oxide (ITZO). Accordingly, the third conductive pattern group includes the pixel electrode 14, the gate pad upper electrode 28, and the upper data pad electrode 34. The pixel electrode 14 has a first end electrically connected to the drain electrode 12 through the first contact hole 13, and a second end electrically connected to the storage electrode 22 through the second contact hole 21. In addition, the gate pad upper electrode 28 is electrically connected to the gate pad lower electrode 26 through the third contact hole 27, and the upper data pad electrode 34 is electrically connected to the lower data pad electrode 32 through the fourth contact hole 33.

However, as described above, the TFT array substrate and method of fabricating the TFT array substrate includes a four-round mask process that includes complex, individual fabrication processes having relatively high production costs.

SUMMARY OF THE INVENTION

Accordingly, the present invention is directed to a thin film transistor array substrate and a method of fabricating a thin film transistor array substrate that substantially obviates one or more of the problems due to limitations and disadvantages of the related art.

An object of the present invention is to provide a thin film transistor array substrate having reducing fabrication costs.

Another object of the present invention is to provide a method of fabricating a thin film transistor array substrate having simplified fabrication processes and costs.

Additional features and advantages of the invention will be set forth in the description which follows, and in part will be apparent from the description, or may be learned by practice of the invention. The objectives and other advantages of the invention will be realized and attained by the structure particularly pointed our in the written description and claims hereof as well as the appended drawings.

To achieve these and other advantages and in accordance with the purpose of the present invention, a thin film transistor array substrate includes a gate line formed on a substrate, a data line formed on the substrate intersecting with the gate line to define a pixel region, a thin film transistor formed at the intersection of the gate line and the data line, the thin film transistor including gate electrode formed on the substrate, a gate insulating layer formed on the gate electrode and the substrate, a semiconductor layer formed on the gate insulating layer, an ohmic contact layer on the semiconductor layer, and a source electrode and a drain electrode on the ohmic contact layer, and a transparent electrode material within the pixel region and connected to the drain electrode of the thin film transistor, wherein the gate insulating layer includes a gate insulating pattern underlying the data line and the transparent electrode material, and covering the gate line.

In another aspect, a method of fabricating a thin film transistor array substrate includes forming a first conductive pattern group including a gate line, a gate pad, and a gate electrode of a thin film transistor, the thin film transistor connected to the gate line on a substrate, forming a gate insulating film on the substrate including the first conductive pattern group, forming a second conductive pattern group including a data line intersecting the gate line, a source electrode of the thin film transistor connected to the data line, and a drain electrode of the thin film transistor, an ohmic contact layer, and a semiconductor layer for forming a channel region of the thin film transistor, forming a third conductive pattern group including a transparent electrode material connected to the drain electrode, and etching the gate insulating film and the ohmic contact layer using the second and the third conductive pattern groups as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate embodiments of the invention and together with the description serve to explain the principles of the invention. In the drawings:

FIGS. 12A to 12D are cross sectional views of the exemplary third mask process of FIGS. 11A and 11B according to the present invention; and FIGS. 13A to 13E are cross sectional views of another exemplary fabrication method for a thin film transistor substrate according to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
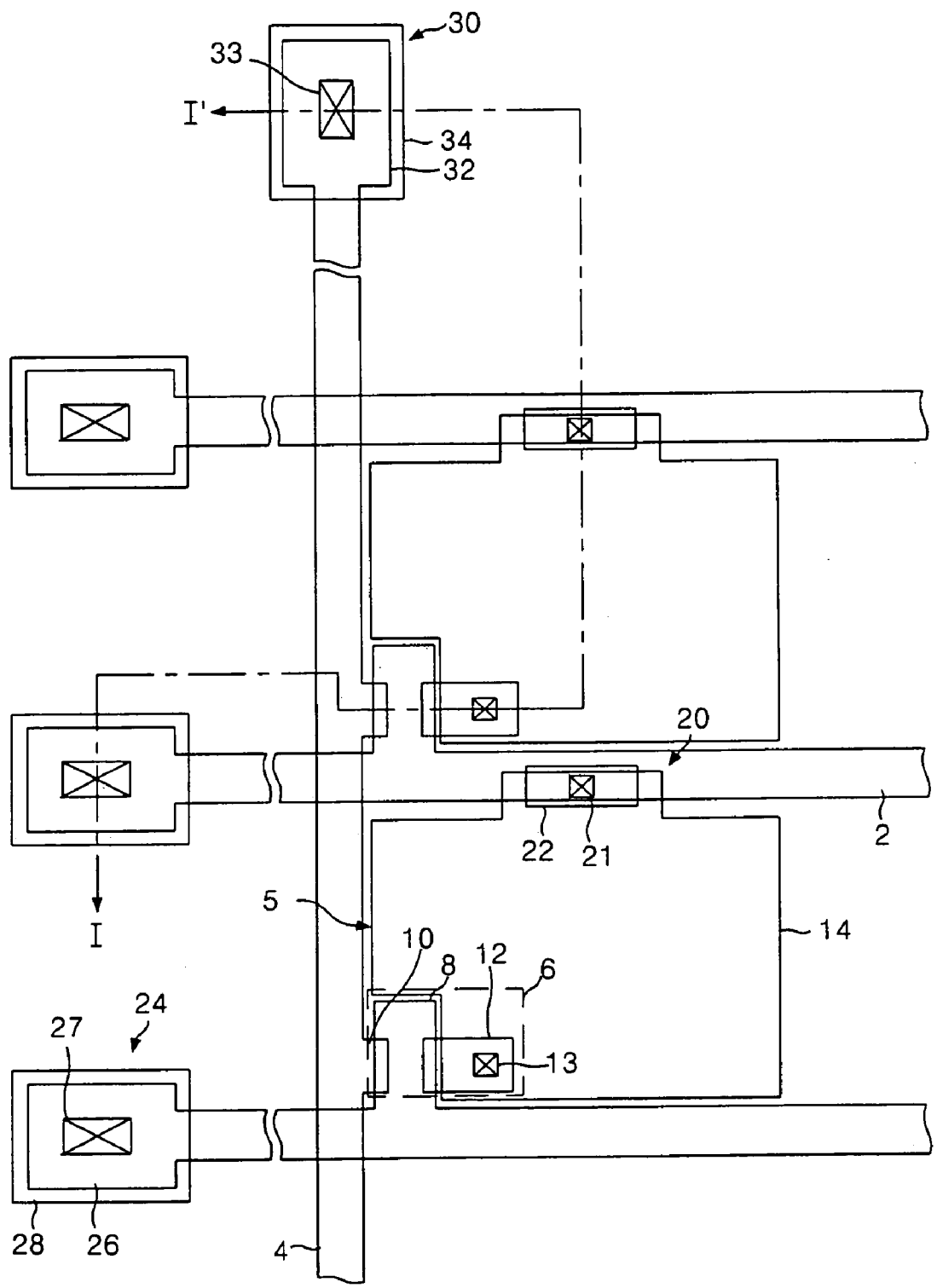
FIG. 1 is a plan view of a thin film transistor array substrate according to the related art.
Figure 2:
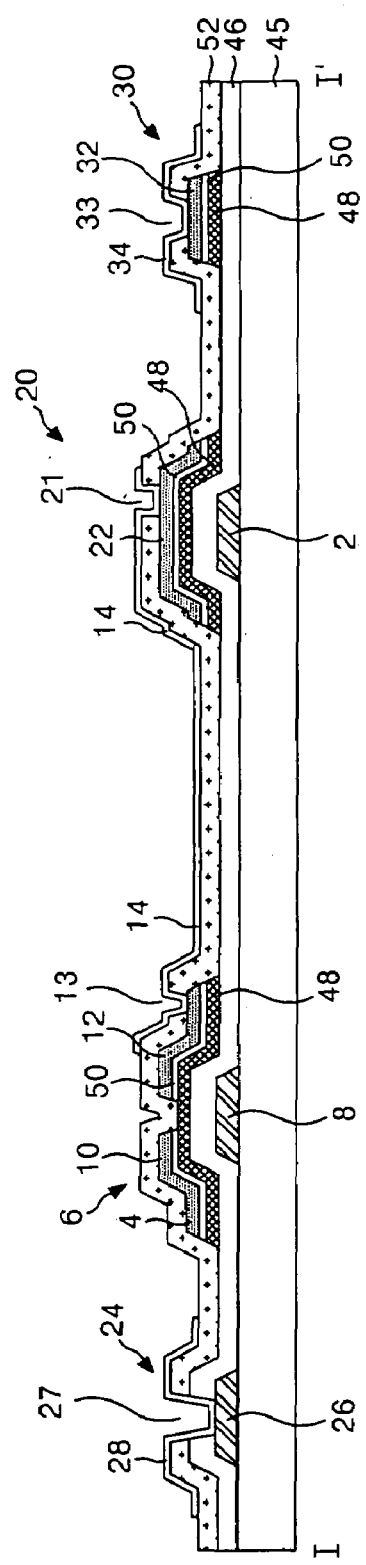
FIG. 2 is a cross sectional view along I–I' of FIG. 1 according to the related art.
Figure 3A:
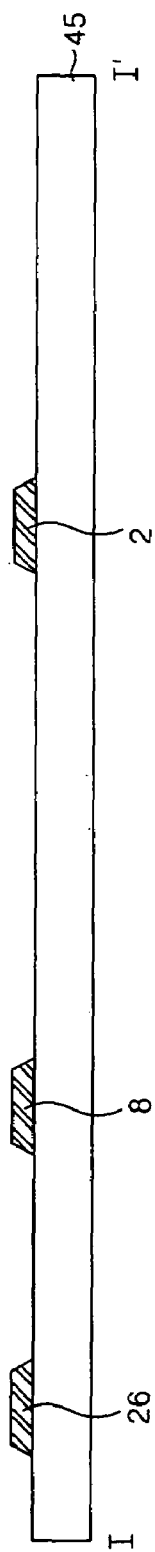
FIGS. 3A to 3D are cross sectional views of a method of fabricating the thin film transistor array substrate of FIG. 2 according to the related art.
Figure 3B:
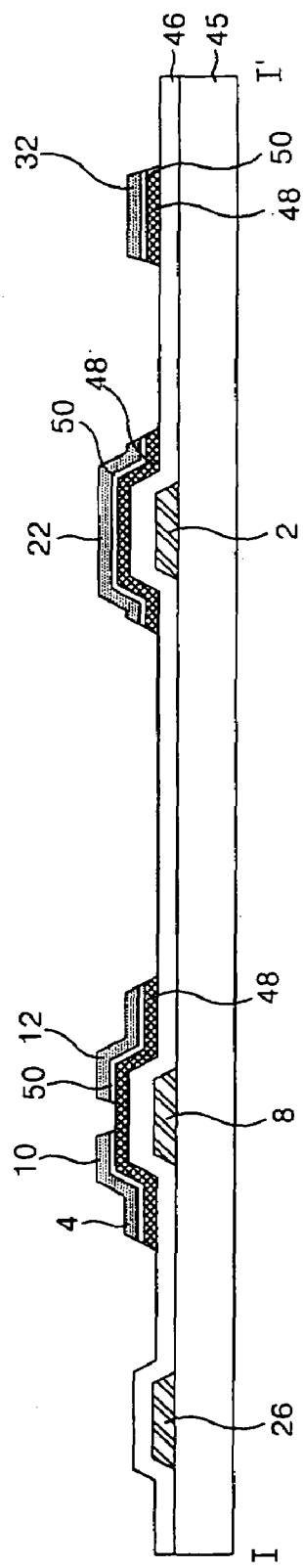
Figure 3C:
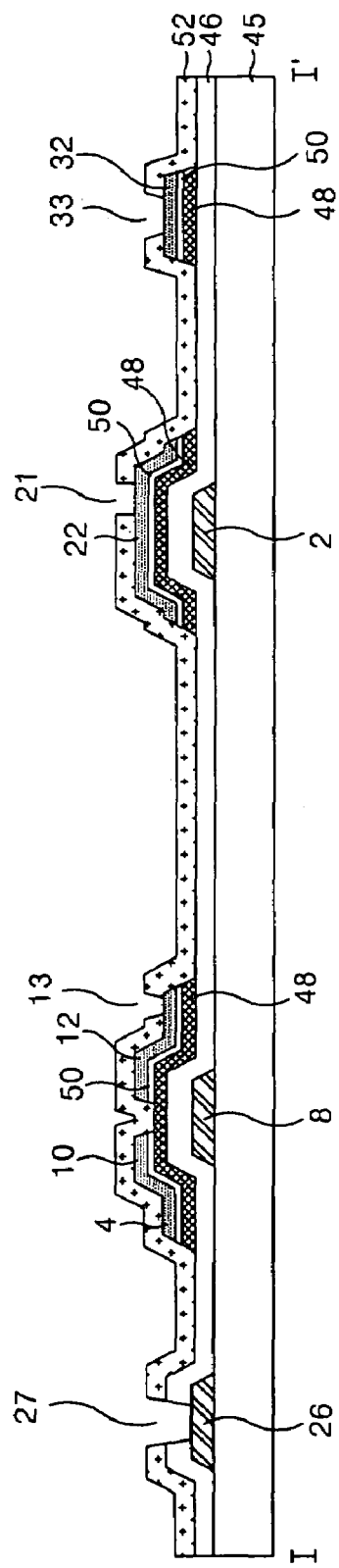
Figure 3D:
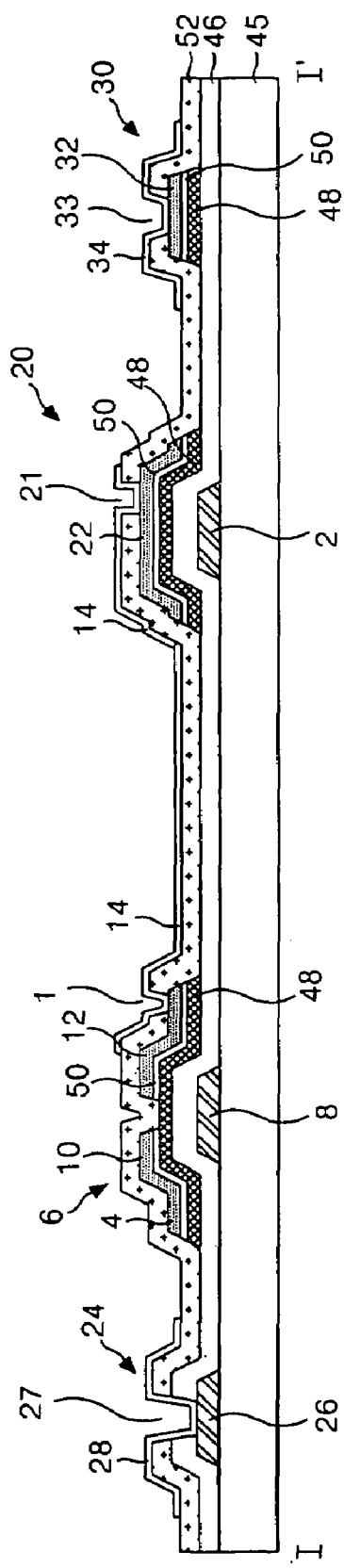
Figure 4:
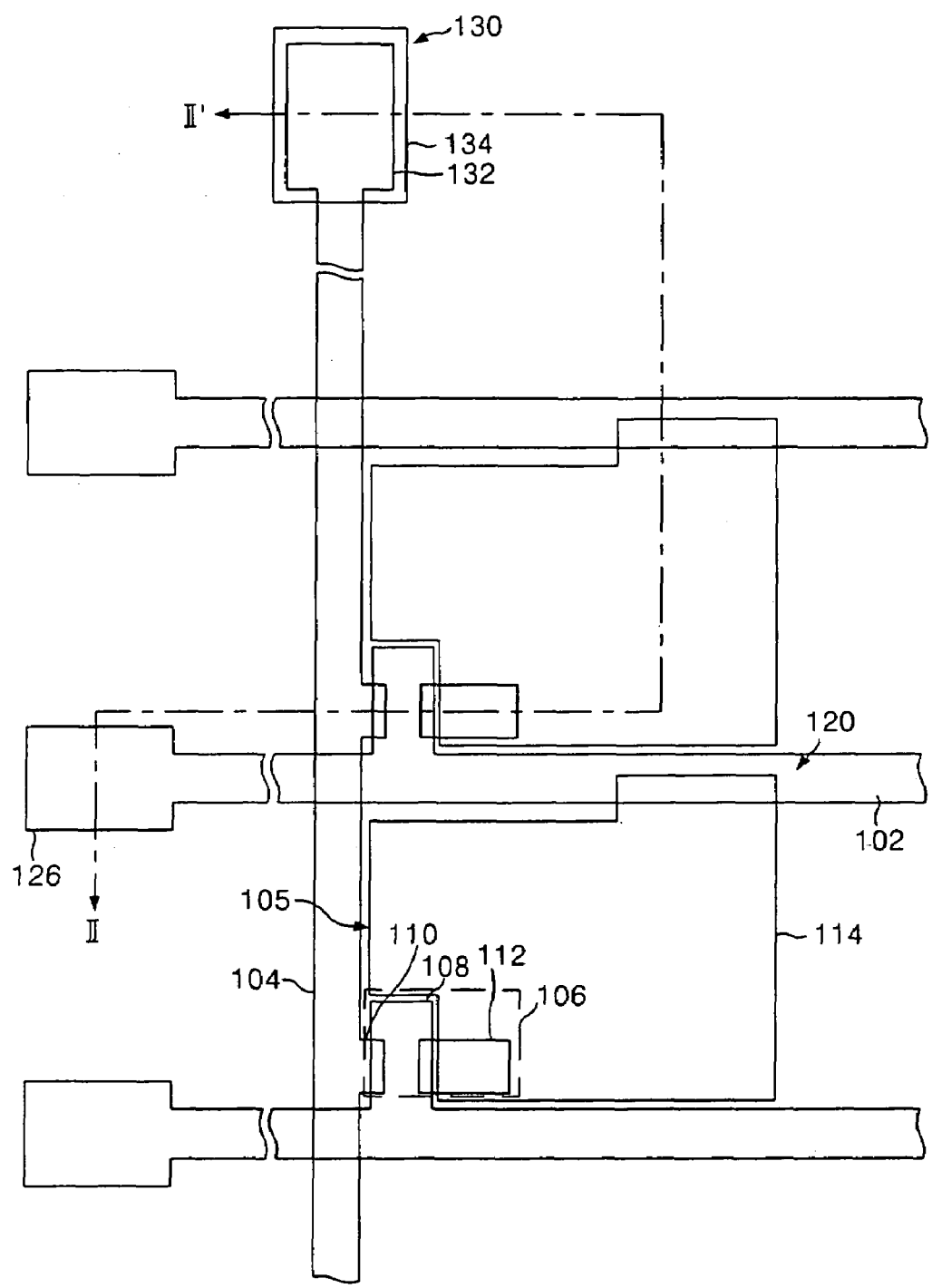
FIG. 4 is a plan view of an exemplary thin film transistor array substrate according to the present invention.
Figure 5:
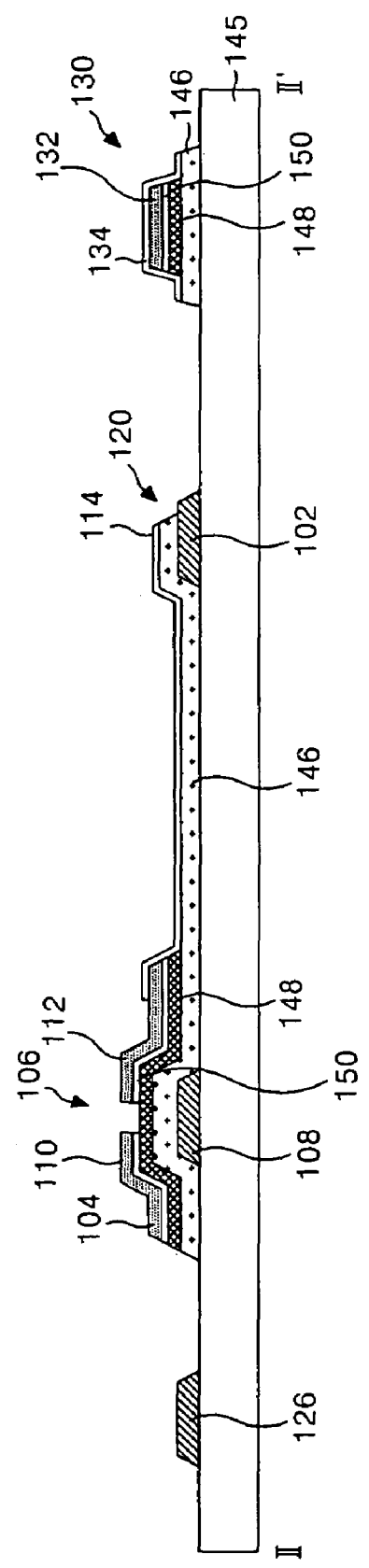
FIG. 5 is a cross sectional along II–II' of FIG. 4 according to the present invention.

FIG. 4 is a plan view of an exemplary thin film transistor array substrate according to the present invention, and FIG. 5 is a cross sectional along II–II' of FIG. 4 according to the present invention. In FIGS. 4 and 5, a TFT array substrate may include a gate line 102 and a data line 104, which may have a gate insulating pattern 146 disposed therebetween, formed on a lower substrate 145 to intersect each other, a TFT 106 formed at each intersection of the gate and data lines 102 and 104, a pixel electrode 114 within a pixel region 105 defined by the intersection of the gate and data lines 102 and 104, a storage capacitor 120 formed at an overlapped portion between the gate line 102 and the pixel electrode 114, a gate pad 24 extending from the gate line 102, and a data pad 130 connected to the data line 104.

The gate insulating pattern 146 may have a pattern similar to the data line 104, a channel region of the TFT 106, a source electrode 110, a drain electrode 112, and the pixel electrode 114, and may be formed to cover the gate line 102 and a gate electrode 108. Accordingly, the TFT 106 may respond to gate signals transmitted along the gate line 102 so that pixel signals transmitted along the data line 104 may be charged to the pixel electrode 114. Thus, the TFT 106 may include a gate electrode 108 connected to the gate line 102, a source electrode 110 connected to the data line 104, and a drain electrode 112 connected to the pixel electrode 114. In addition, the thin film transistor 106 may include an active layer 148 overlapping the gate electrode 108 with a gate insulating pattern 146 positioned between the thin film transistor 106 and the gate electrode 108, thereby defining a channel region between the source electrode 110 and the drain electrode 112.

In FIG. 5, the active layer 148 may be formed to underlie the data line 114 and a lower data pad electrode 132, and may overlapped by an ohmic contact layer 150 for making ohmic contact with the data line 104, the drain electrode 112, and the lower data pad electrode 132. In addition, the pixel electrode 114 may be directly connected to the drain electrode 112 of the thin film transistor 106 and may be formed within the pixel region 105. Accordingly, an electric field may be formed between the pixel electrode 114, which may receive the pixel signals supplied via the TFT 106, and a common electrode (not shown), which may receive reference voltages. Thus, liquid crystal molecules arranged between the TFT array substrate and the color filter array substrate by an induced electric field may rotate due to dielectric anisotropy. Therefore, light transmittance within the pixel region 105 may differ in accordance with a rotation amount of the liquid crystal molecules, thereby producing images.

The storage capacitor 120 may include a gate line 102 and a pixel electrode 114 overlapping the gate line 102 with the gate insulating film 146 disposed therebetween. Accordingly, the storage capacitor 120 may allow a pixel signal charged in the pixel electrode 114 to be stably maintained until a next pixel signal is charged in the pixel electrode 114. In addition, the gate pad 126 may extend from the gate line 102 to have an exposed structure of metal layer. Although not shown, the gate pad 126 may be connected to a gate driver, and may supply gate signals provided from the gate driver to the gate line 102. Furthermore, the data pad 130 may include a lower data pad electrode 132 extending from the data line, and an upper data pad electrode 134 connected to the lower data pad electrode 132 and formed as an identical metal to the gate insulating pattern 146, as shown in FIG. 5. Although not shown, the data pad 130 may be connected to a data driver, and may supply data signals provided from the data driver to the data line 104.

Figure 6:
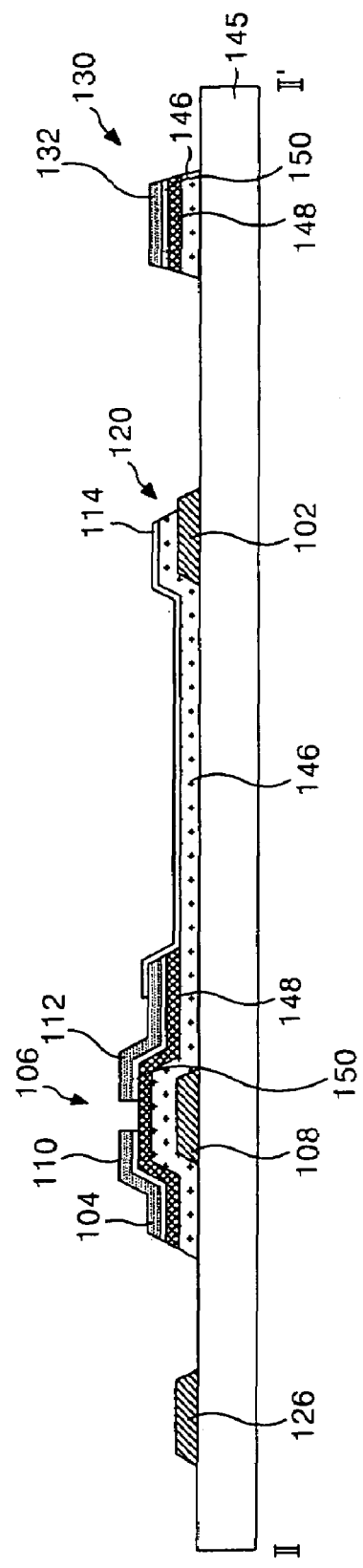
FIG. 6 is a cross sectional view of another exemplary thin film transistor array substrate similar to the exemplary thin film transistor array substrate of FIG. 4 according to the present invention.

FIG. 6 is a cross sectional view of another exemplary thin film transistor array substrate similar to the exemplary thin film transistor array substrate of FIG. 4 according to the present invention. In FIG. 6, the data pad 130 may extend from the data line 104, and may be formed as an exposed structure of the lower data pad electrode 132. Thus, the lower data pad electrode 132 may be formed as an identical pattern to the gate insulating pattern 146. As shown in FIG. 6, the gate insulating pattern 146 includes a portion that corresponds to a pattern of the lower data pad electrode 132 and/or a portion of the active layer 148 and/or a portion of the ohmic contact layer 150 that underlies the lower data pad electrode 132. Accordingly, sidewall portions of the gate insulating pattern 146, the active layer 148, the ohmic contact layer 150, and the lower data pad electrode 132 may be coincident, i.e. positioned along a common inclined plane. In addition, although not shown, an alignment film may be formed within an image display area except for a pad region in which the gate pad 126 and the data pad 130 may be formed.

Figure 7A:
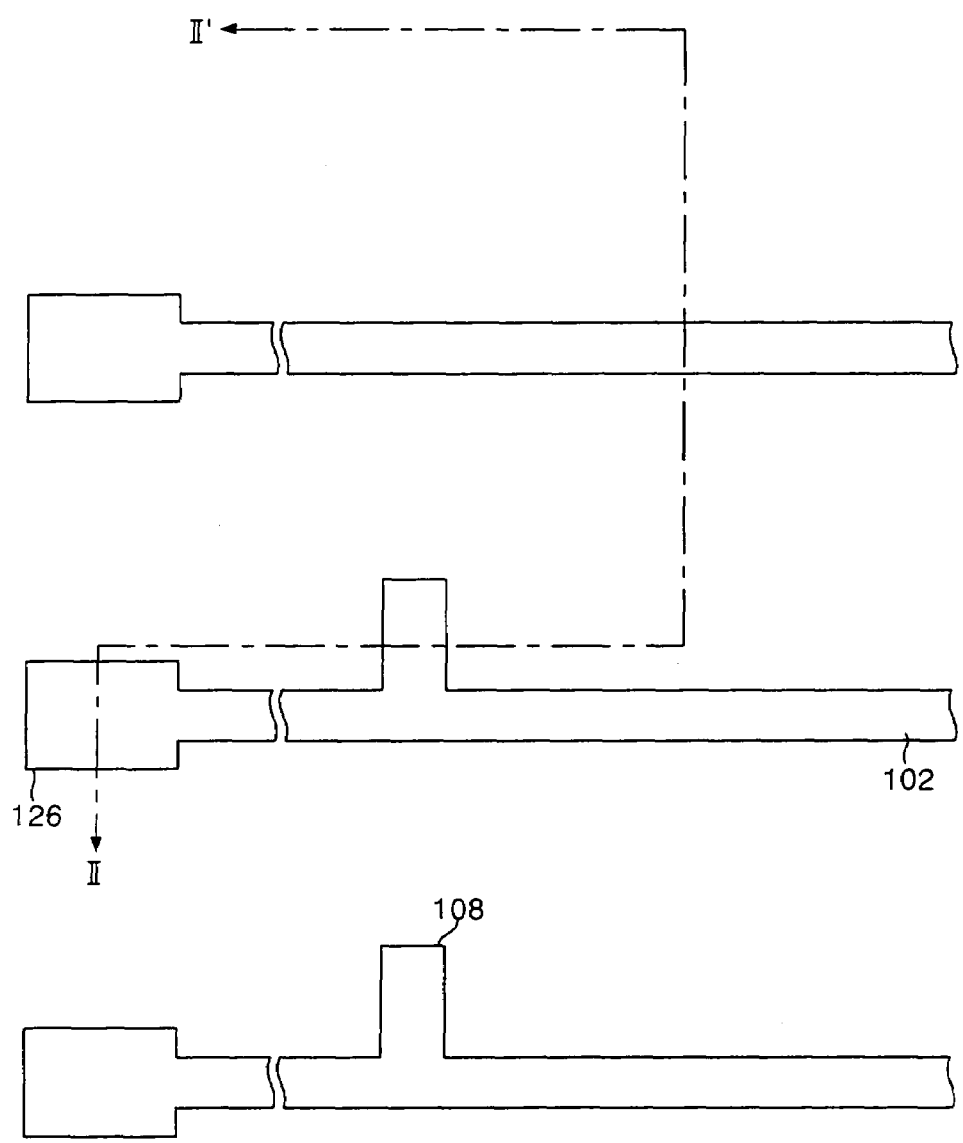
FIG. 7A is a plan view of an exemplary first mask process of a fabrication method for a thin film transistor array substrate according to the present invention.
Figure 7B:
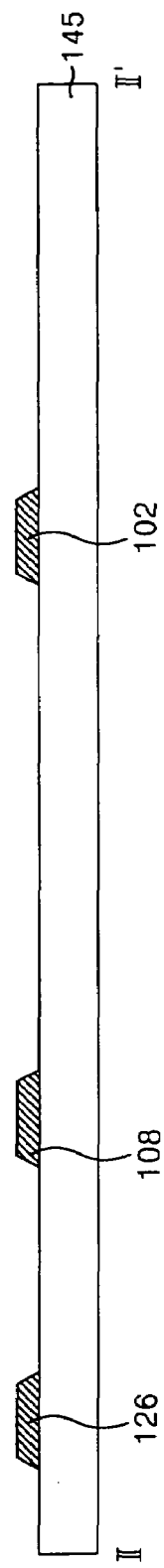
FIG. 7B is a sectional view of the exemplary first mask process of FIG. 7A according to the present invention.

FIG. 7A is a plan view of an exemplary first mask process of a fabrication method for a thin film transistor array substrate according to the present invention, and FIG. 7B is a sectional view of the exemplary first mask process of FIG. 7A according to the present invention. In FIGS. 7A and 7B, a first conductive pattern group including the gate line 102, the gate electrode 108, and the gate pad 126 may be formed on the lower substrate 145 using a first mask process.

Figure 8A:
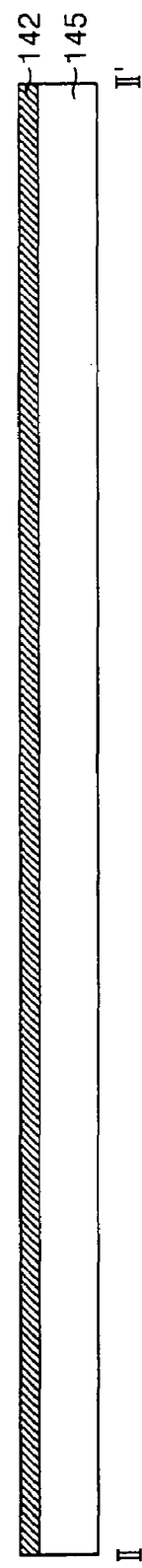
FIGS. 8A to 8C are cross sectional views of the exemplary first mask process of FIGS. 7A and 7B according to the present invention.
Figure 8B:
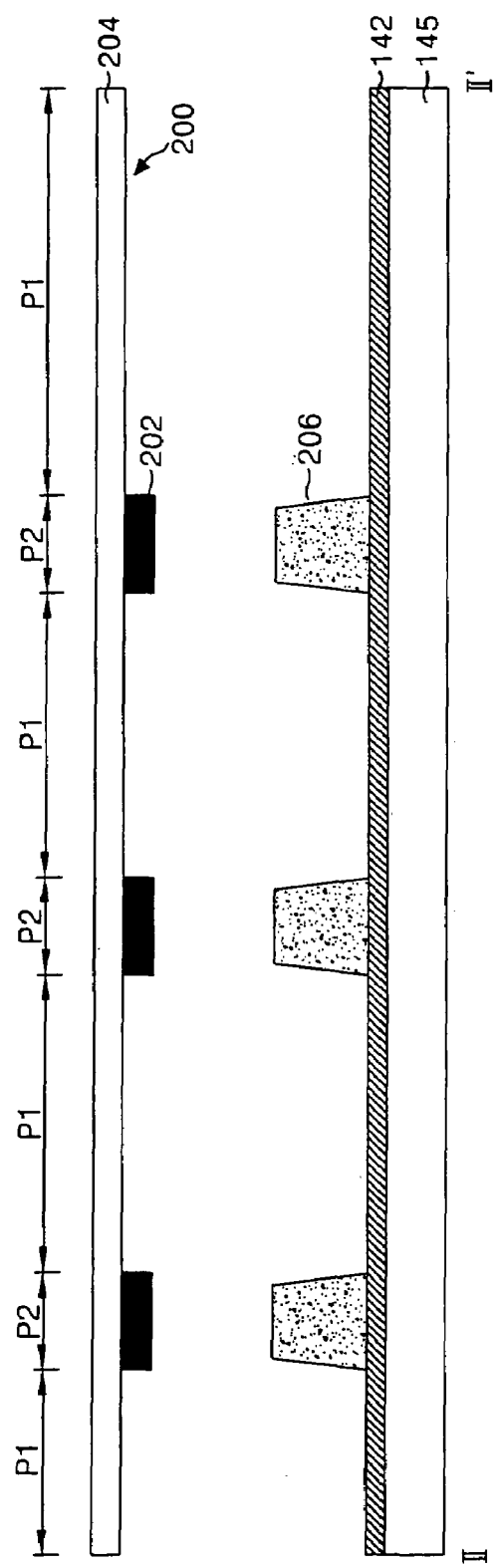
Figure 8C:
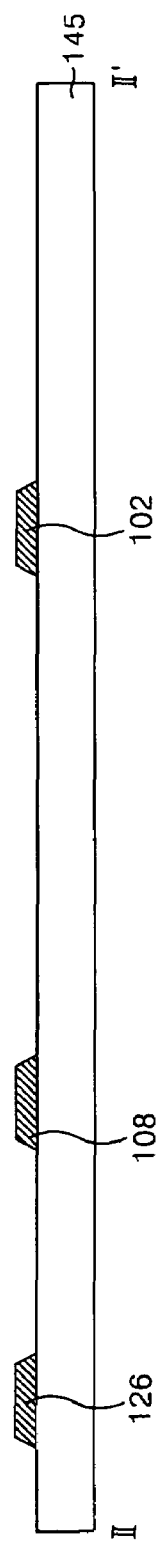

FIGS. 8A to 8C are cross sectional views of the exemplary first mask process of FIGS. 7A and 7B according to the present invention. In FIG. 8A, a gate metal layer 142 may be formed on the upper substrate 145 by a deposition method, such as sputtering. Herein, the gate metal layer 142 may be made of a metal, such as an aluminum (Al) system metal, molybdenum (Mo), and copper (Cu). Subsequently, a photo-resist film may be entirely formed on the gate metal layer 142, and a first mask 200 may be arranged on the lower substrate 145, as shown in FIG. 8B. The first mask 200 may include a mask substrate 204, which may be a transparent material, and a shielding part 202 formed on a shielding region P2 of the mask substrate 204. Accordingly, a region in which the mask substrate 204 is exposed may become an exposure region P1. Next, the photo-resist film may be exposed using the first mask 200 and developed to form the photo-resist pattern 206 corresponding to the shielding part 202 of the first mask 200. Then, the gate metal layer may be patterned by an etching process using the photo-resist pattern 206 to form the first conductive pattern group including the gate line 102, the gate electrode 108, and the gate pad 126, as shown in FIG. 8C.

Figure 9A:
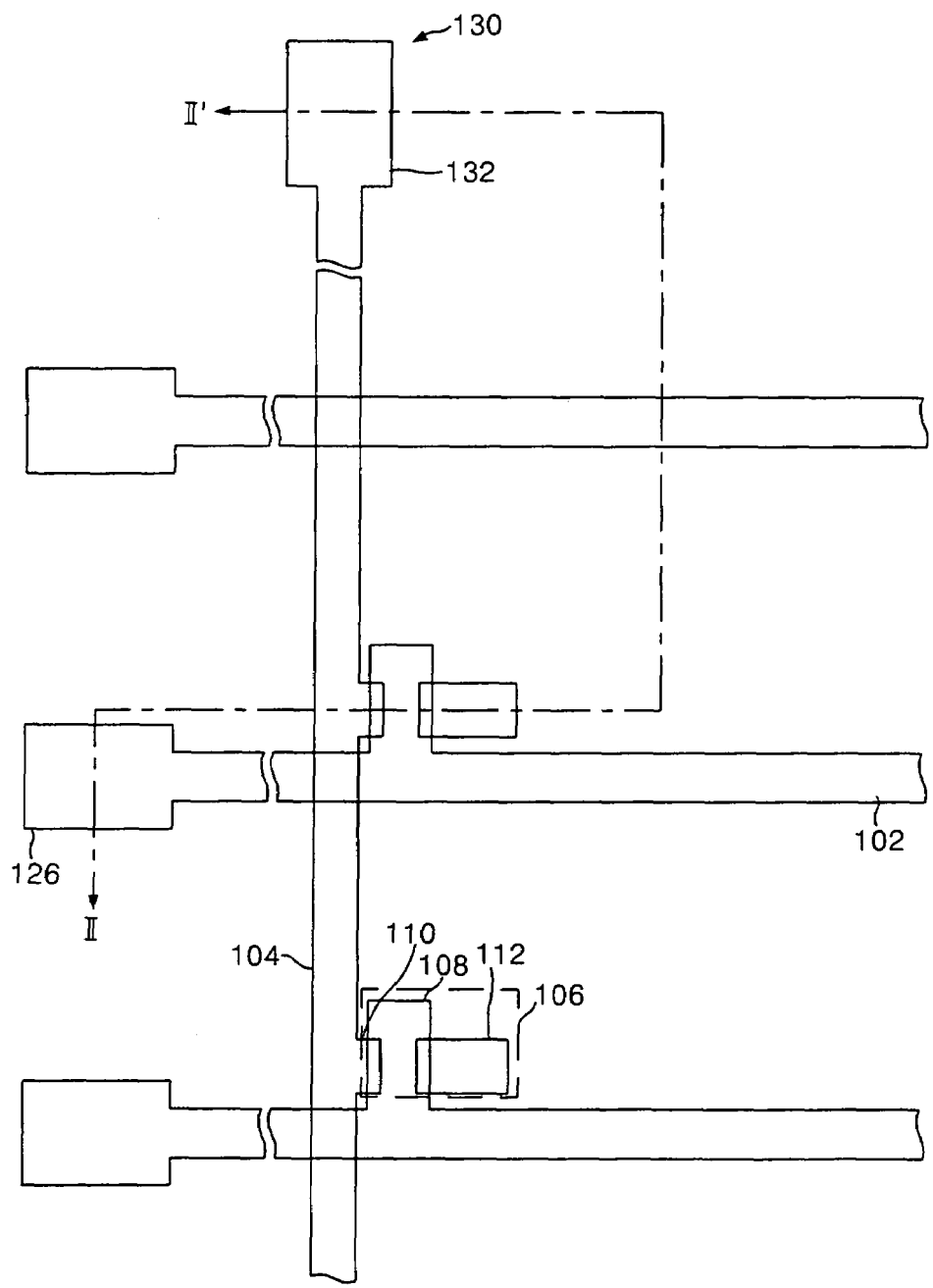
FIG. 9A is a plan view of an exemplary second mask process of a fabrication method for a thin film transistor array substrate according to the present invention.
Figure 9B:
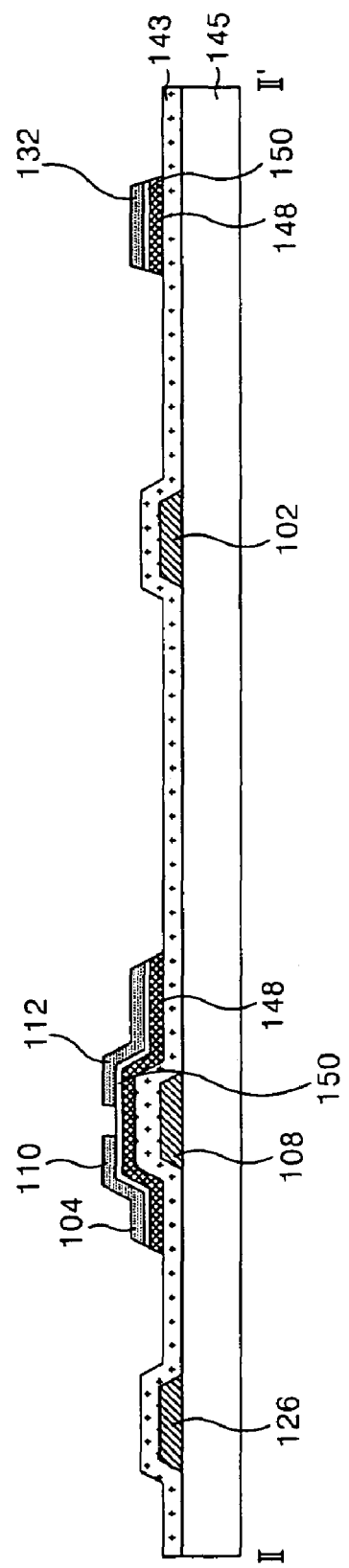
FIG. 9B is a sectional view of the exemplary second mask process according to the present invention.

FIG. 9A is a plan view of an exemplary second mask process of a fabrication method for a thin film transistor array substrate according to the present invention, and FIG. 9B is a sectional view of the exemplary second mask process according to the present invention. In FIG. 9B, a gate insulating film 143 may be formed on the lower substrate 145 provided with the first conductive pattern group by a deposition method, such as PECVD or sputtering. The gate insulating film 143 may be made of an inorganic insulating material, such as a silicon oxide ($SiO_x$) or a silicon nitride ($SiN_x$).

In FIG. 9B, a semiconductor pattern including an active layer 148 and the ohmic contact layer 150 may be stacked, and a second conductive pattern group including the data line 104, the drain electrode 112, and the lower data pad electrode 132 may be formed using a second mask process.

Figure 10A:
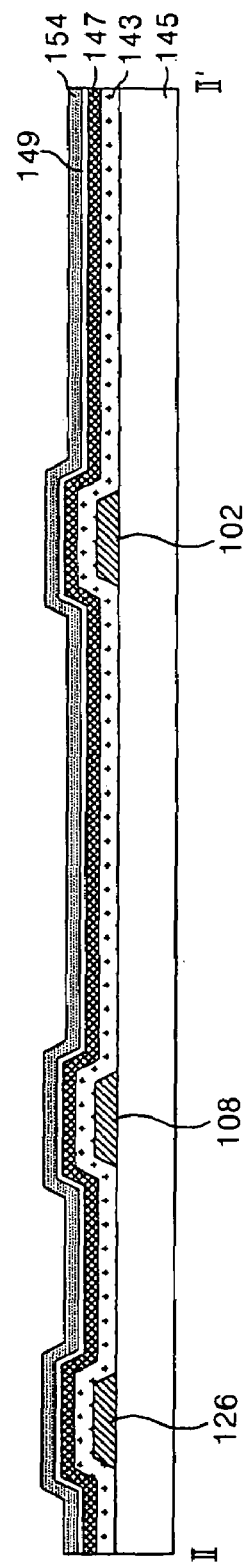
FIGS. 10A to 10E are cross sectional views of the exemplary second mask process of FIGS. 9A and 9B according to the present invention.

FIGS. 10A to 10E are cross sectional views of the exemplary second mask process of FIGS. 9A and 9B according to the present invention. In FIG. 10A, a first semiconductor layer 147, a second semiconductor layer 149, and a source/drain metal layer 154 may be sequentially formed on the gate insulating film 143 by deposition techniques, such as PECVD and sputtering. For example, the first semiconductor layer 147 may be made of an undoped amorphous silicon, the second conductor layer 149 may be made of amorphous silicon doped with an impurity of a N-type or P-type, and the source/drain metal layer 154 may be made of molybdenum (Mo) and/or copper (Cu).

Figure 10B:
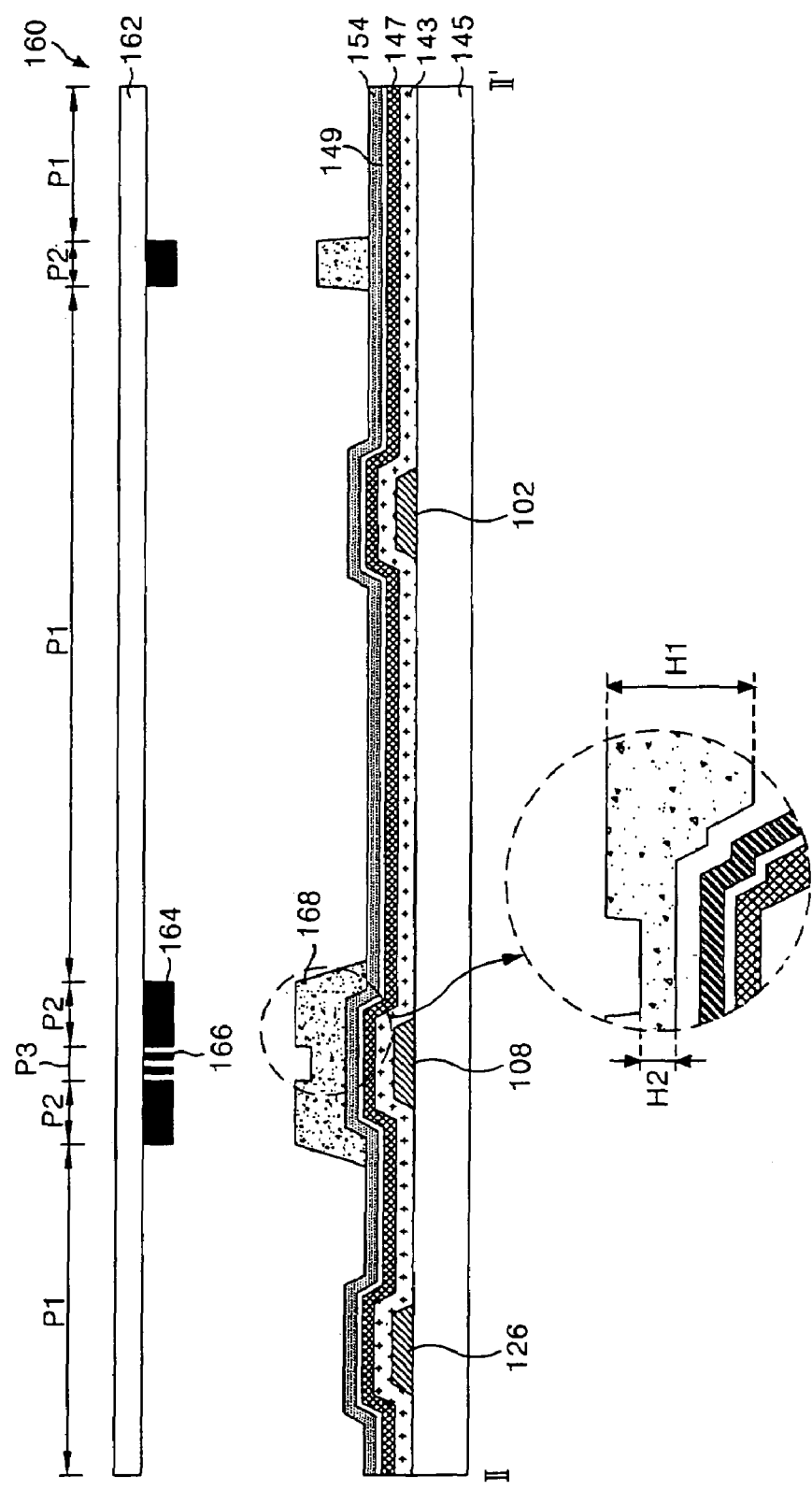

In FIG. 10B, a photo-resist film may be formed on the source/drain metal layer 154 and a second mask 160, which may be used for a partial exposure, may be arranged on the lower substrate 145. The second mask 160 may include a mask substrate 162 made of a transparent material, a shielding part 164 formed on a shielding region P2 of the mask substrate 162, and a diffractive exposure part 166 (or a semi-transmitting part) formed on a partial exposure region P3 of the mask substrate 162. Accordingly, a region in which the mask substrate 162 is exposed may become an exposure region P1. Next, the photo-resist film may be exposed using the second mask 160 and then developed to form the photo-resist pattern 168, which may have a stepped part within the shielding region P2 disposed to either side of the partial exposure region P3 corresponding to the diffractive exposure part 166 and shielding part 164 of the second mask 160. That is, the photo-resist pattern 168 formed within the partial exposure region P3 may have a second height H2 that may be lower than a first height H1 of the photo-resist pattern 168 formed within the shielding region P2.

Figure 10C:
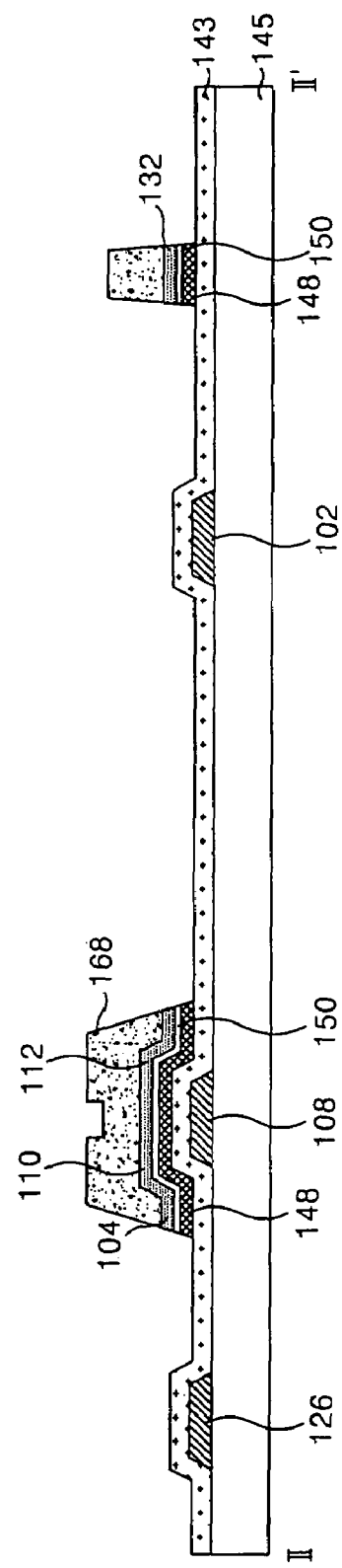

In FIG. 10C, the source/drain metal layer 154 may be patterned by a wet etching process using the photo-resist pattern 168 as a mask. Accordingly, the second conductive pattern group including the data line 104, the drain electrode 112, and the source electrode 110 connected to the data line 104, and the lower data pad electrode 132 may be formed.

Figure 10D:
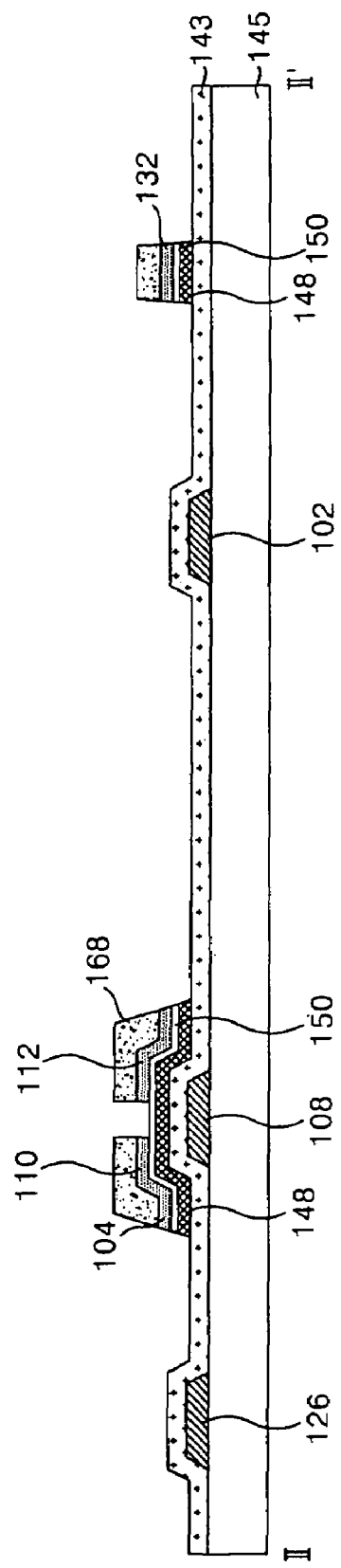

In FIG. 10D, the first semiconductor layer 147 and the second semiconductor layer 149 may be patterned by a dry etching process using the photo-resist pattern 168 as a mask to provide the ohmic contact layer 150 and the active layer 148 along the source/drain metal pattern. Next, the photo-resist pattern 168 formed having the second height H2 within the partial exposure region P3 may be removed by an ashing process using an oxygen ($O_2$) plasma. Accordingly, the photo-resist pattern 168 formed with the first height H1 within the shielding region P2 may have a lowered height. In addition, the second source/drain metal layer 154 formed at a channel region of the TFT 106 (in FIG. 9A) may be removed by an etching process using the photo-resist pattern 168. Accordingly, the drain electrode 112 may be electrically separated from the source electrode 110.

Figure 10E:
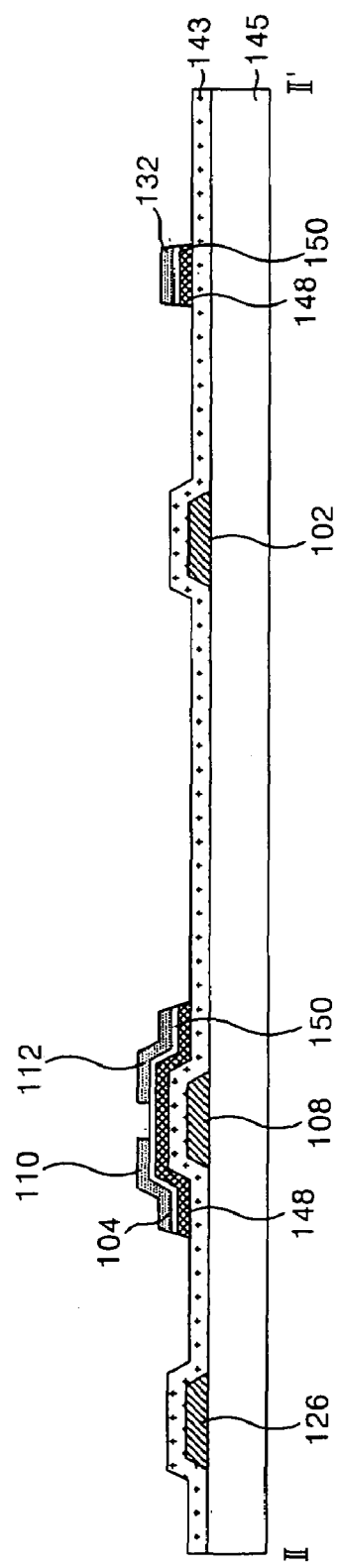

In FIG. 10E, portions of the photo-resist pattern 168 remaining on the second conductive pattern group may be removed by a stripping process.

Figure 11A:
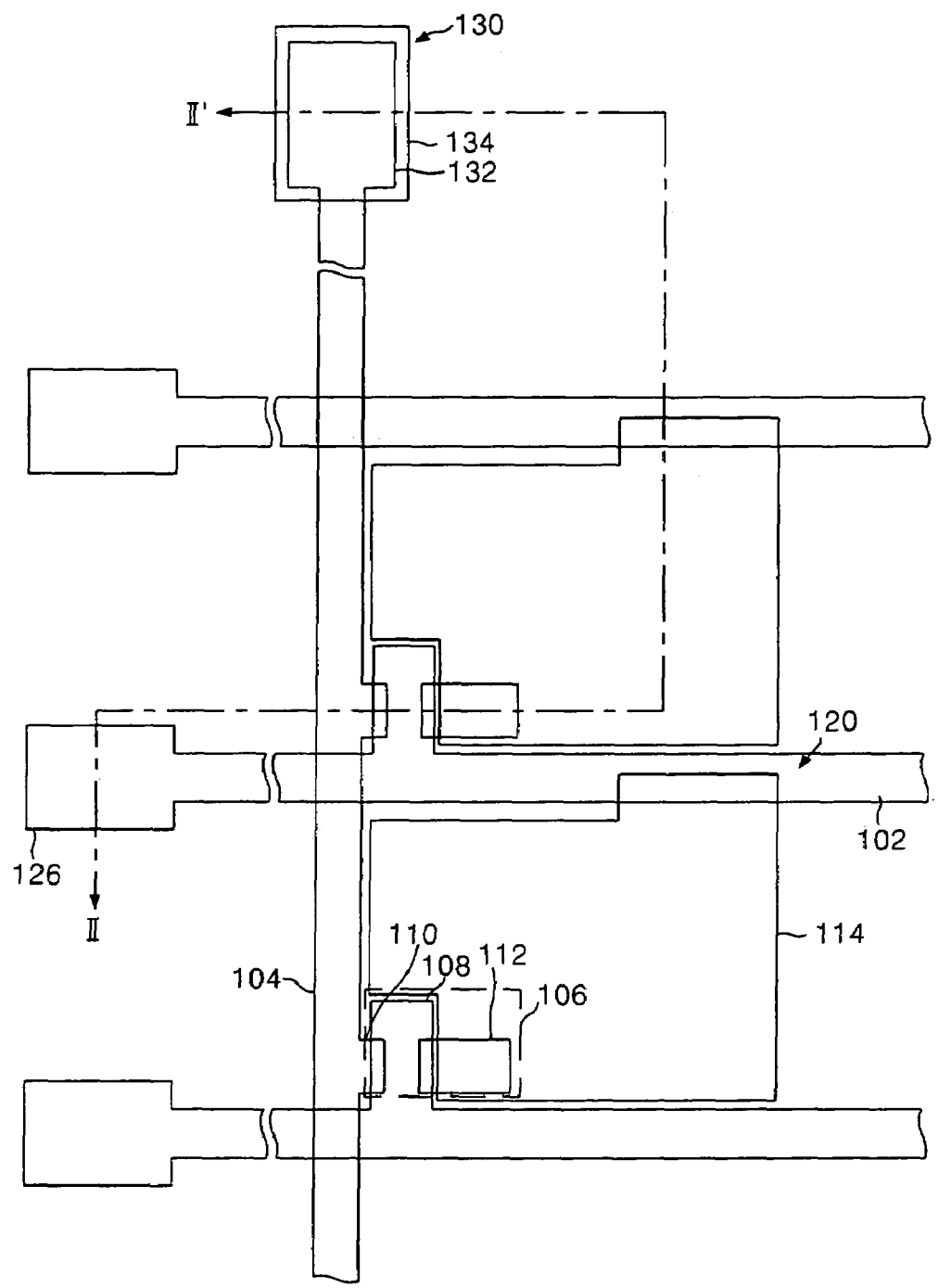
FIG. 11A is a plan view of an exemplary third mask process of a fabrication method for a thin film transistor array substrate according to the present invention.
Figure 11B:
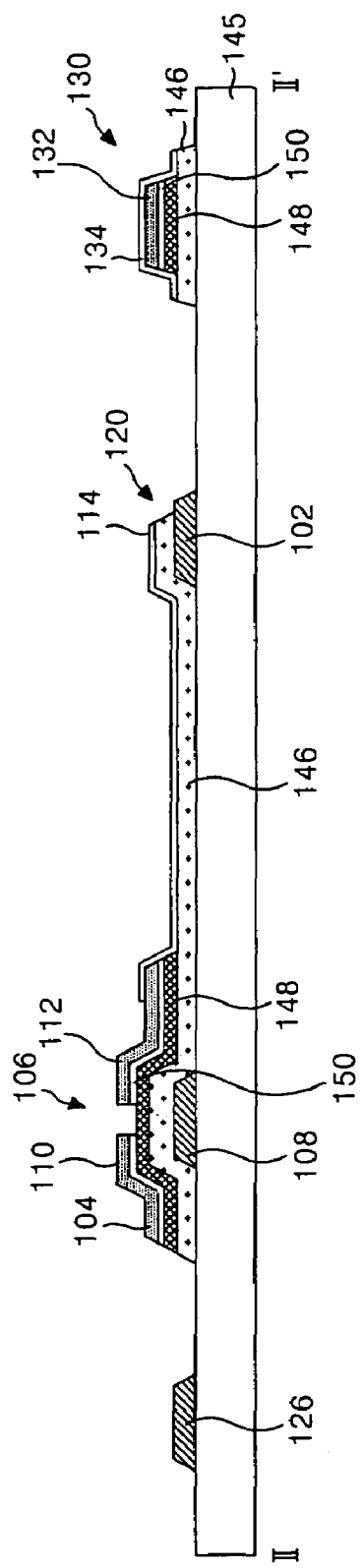
FIG. 11B is a sectional view of the exemplary third mask process according to the present invention.

FIG. 11A is a plan view of an exemplary third mask process of a fabrication method for a thin film transistor array substrate according to the present invention, and FIG. 11B is a sectional view of the exemplary third mask process according to the present invention. In FIGS. 11A and 11B, a third conductive pattern group including the upper data pad electrode 134 and the pixel electrode 114 may be formed using a third mask process on the gate insulating pattern 146 upon which the semiconductor pattern and the source/drain metal pattern may have been previously formed.

Figure 12A:
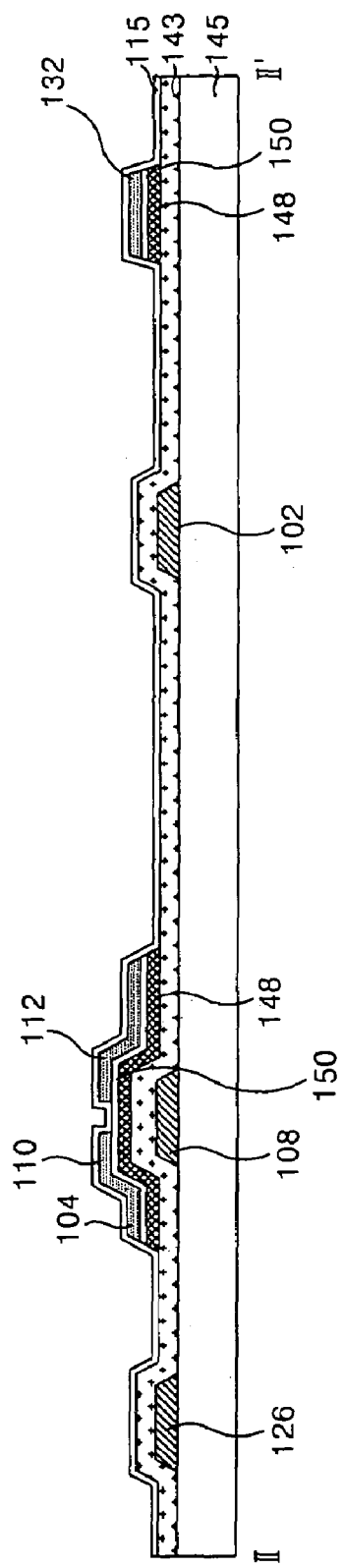

FIGS. 12A to 12D are cross sectional views of the exemplary third mask process of FIGS. 11A and 11B according to the present invention. In FIG. 12A, a transparent conductive film 115 may be formed on the gate insulating film 143 in which the semiconductor pattern and the source/drain metal pattern may be stacked, using a deposition technique, such as sputtering. The transparent conductive film may be made of indium-tin-oxide (ITO), tin-oxide (TO), indium-zinc-oxide (IZO), or indium-tin-zinc-oxide (ITZO).

In FIG. 12B, a photo-resist film may be entirely formed on the transparent conductive film 115, and a third mask 210 may be arranged on an upper portion of the lower substrate 145. The third mask 210 may include a mask substrate 214, which may be formed of a transparent material, and a shielding part 212 formed on a shielding region P2 of the mask substrate 214. Accordingly, a region in which the mask substrate 214 is exposed may become an exposure region P1. Then, the photo-resist film may be exposed using the third mask 210, and developed to form the photo-resist pattern 216 in the shielding region P2 corresponding to the shielding part 212 of the third mask 210.

Figure 12C:
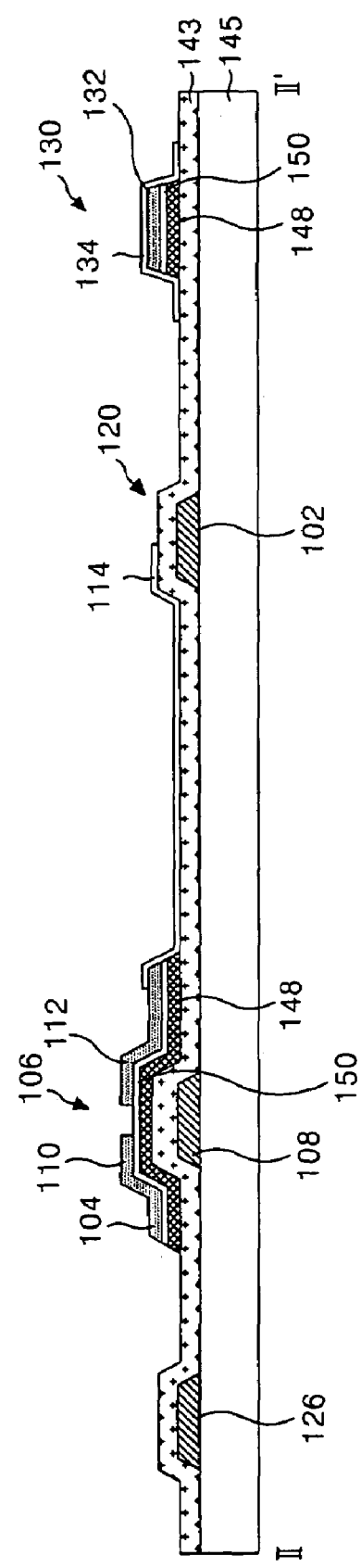

In FIG. 12C, the transparent conductive film 115 may be patterned by an etching process using the photo-resist pattern 216, so that a third conductive pattern group including the pixel electrode 114 and the upper data pad electrode 134 may be formed.

Figure 12D:
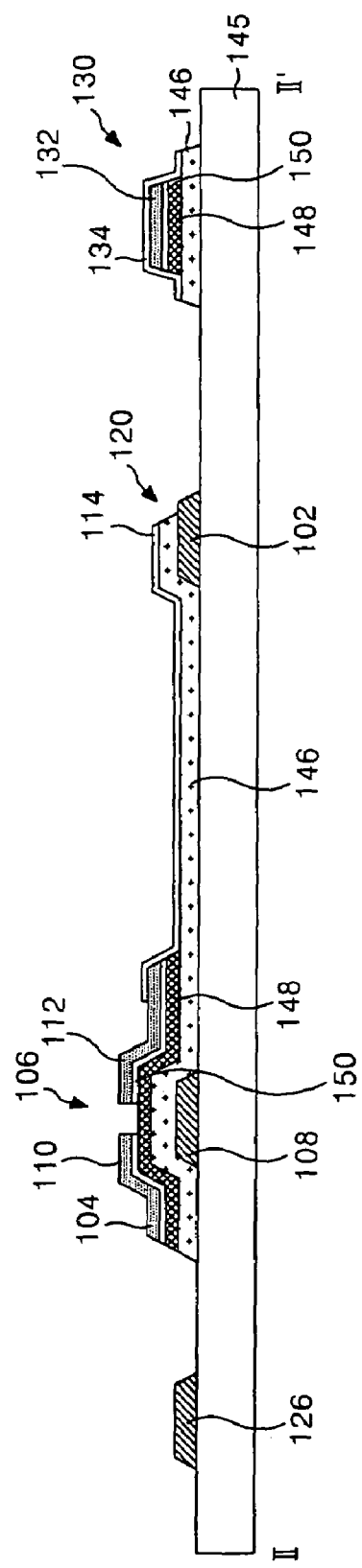

In FIG. 12D, the gate insulating film 143 and the ohmic contact layer 150 may be simultaneously patterned by a dry etching process using the second and the third conductive pattern groups as a mask to provide the gate insulating pattern 146. In addition, the ohmic contact layer 150 may be removed at the channel region of the TFT 106. For example, the ohmic contact layer 150 at the channel region of the TFT 106 may be removed to expose the active layer 148, and the gate insulating pattern 146 may be formed so that the gate insulating film 143 on the gate pad 126 may be removed to expose the gate pad 126.

More specifically, when a thickness ratio of the ohmic contact layer 150 and the gate insulating film 143 is above 1:8, an etching gas including sulfur hexa fluoride $SF_6$ and oxygen $O_2$ having a mixture ratio of 1:3 may be injected into a vacuum chamber, thereby dry-etching the ohmic contact layer 150 and the gate insulating film 143 for a first period of time. For example, when a thickness of the ohmic contact layer 150 is about 600Å and a thickness of the gate insulating film 143 is about 5000Å, 1,000 W of electric power is supplied under a pressure of about 100[mT] such that the ohmic contact layer 150 and the gate insulating film 143 are dry-etched by the etching gas for about 90 seconds. Accordingly, the gate insulating film 143 may be patterned such that the gate insulating pattern 146 (in FIG. 12D) exposes the gate pad 126, and the ohmic contact layer 150 is removed at the channel region of the TFT 106 to expose the active layer 148.

Otherwise, when a thickness ratio of the ohmic contact layer 150 and the gate insulating film 143 is above 1:10, an etching gas including tetra fluoro carbon $CF_4$ and hydrogen $H_2$ having a ratio of about 5:1 may be injected into a vacuum chamber, thereby dry-etching the ohmic contact layer 150 and the gate insulating film 143 for a first period of time. For example, 1,000 W of electric power may be supplied under the 100[mT] pressure such that the ohmic contact layer 150 and the gate insulating film 143 are dry-etched by the etching gas for about 90 seconds. Accordingly, the gate insulating film 143 may be patterned such that the gate insulating pattern 146 (in FIG. 12D) exposes the gate pad 126, and the ohmic contact layer 150 is removed at the channel region of the TFT 106 to expose the active layer 148.

Figure 13A:
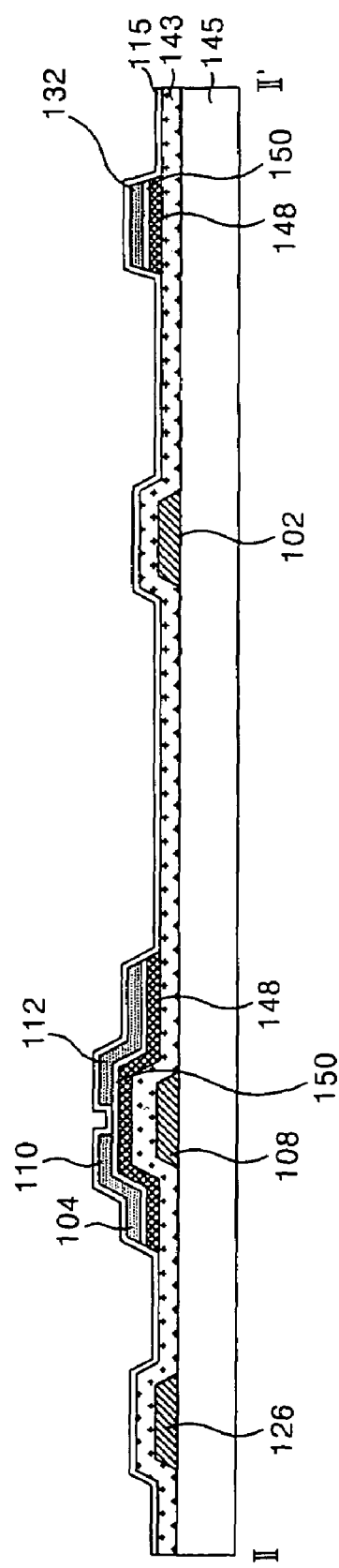

FIGS. 13A to 13E are cross sectional views of another exemplary fabrication method for a thin film transistor substrate according to the present invention. In FIG. 13A, a first conductive pattern group including the gate line 102, the gate electrode 108, and the gate pad 126 may be formed on the lower substrate 145 using the first mask process, as described with reference to FIGS. 8A to 8C.

Then, the semiconductor pattern including an active layer 148 and an ohmic contact layer 150, and a second conductive pattern group including the data line 104, the drain electrode 112, and the lower data pad electrode 132 may be formed on the gate insulating film 143 using the second mask process, as described with reference to FIGS. 10A to 10E.

In FIG. 13A, a transparent conductive film may be formed on the gate insulating film 143 in which the semiconductor pattern and the second conductive pattern group are stacked, by a deposition technique, such as sputtering. The transparent conductive film may be made of indium-tin-oxide (ITO), tin-oxide (TO), indium-zinc-oxide (IZO), or indium-tin-zinc-oxide (ITZO).

Figure 13B:
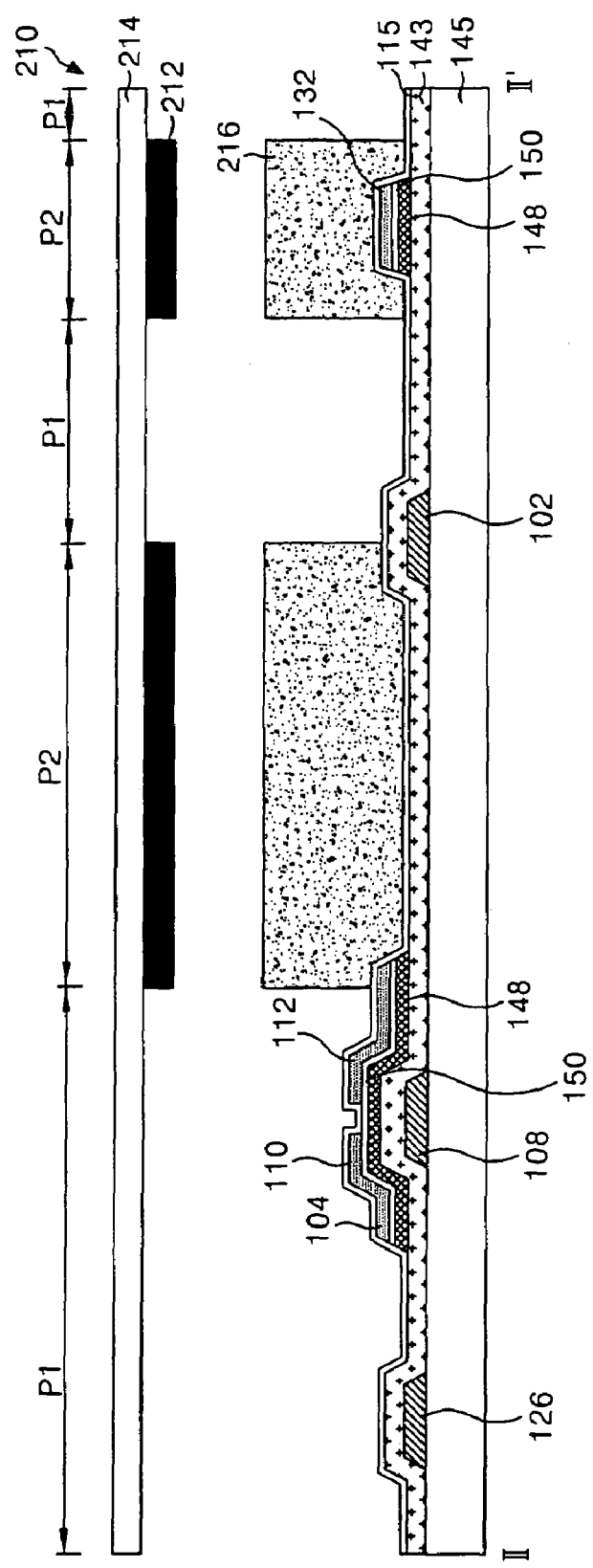

In FIG. 13B, a photo-resist film may be entirely formed on the transparent conductive film 115, and a third mask 210 may be arranged on an upper portion of the lower substrate 145. The third mask 210 may include a mask substrate 214, which is of a transparent material, and a shielding part 212 formed on a shielding region P2 of the mask substrate 214. Accordingly, a region in which the mask substrate 214 is exposed may become an exposure region P1. Then, the photo-resist film may be exposed using the third mask 210, and developed to form the photo-resist pattern 216 in the shielding region P2 corresponding to the shielding part 212 of the third mask 210.

Figure 13C:
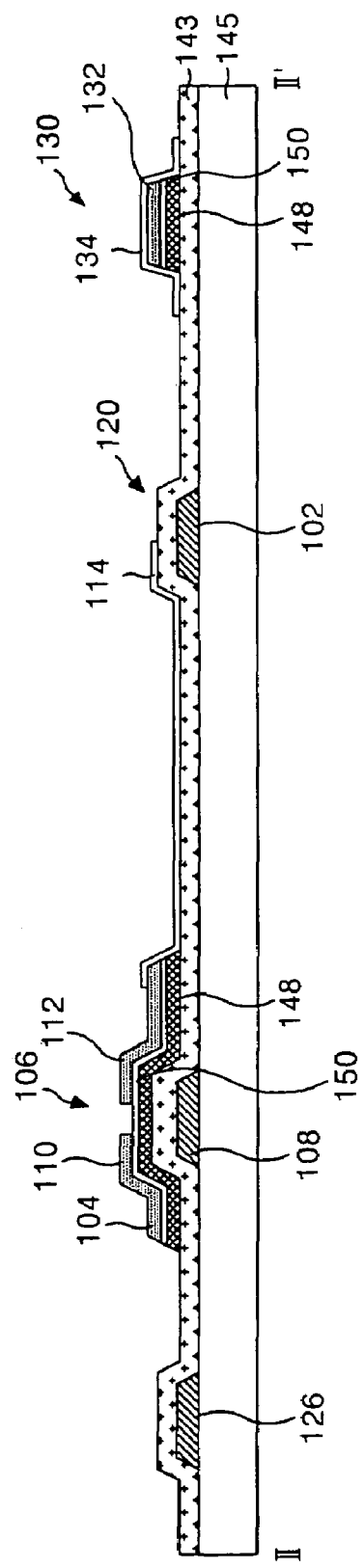

In FIG. 13C, the transparent conductive film 115 may be patterned by an etching process using the photo-resist pattern 216, so that a third conductive pattern group including the pixel electrode 114 and the upper data pad electrode 134 may be formed.

In FIG. 13D, a portion of the ohmic contact layer 150 and the gate insulating film 143 may be simultaneously patterned by a first dry etching process using the second and the third conductive pattern groups as a mask, thereby forming the gate insulating pattern 146. The gate insulating pattern 146 may be formed in order to remove the gate insulating film 143 on the gate pad 126 to expose the gate pad 126. Then, the ohmic contact layer 105 may be patterned by a second dry etching process using the second and the third conductive pattern groups as a mask such that the ohmic contact layer 150 remaining at the channel region of the TFT 106 may be removed. That is, the ohmic contact layer 150 at the channel portion of the thin film transistor 106 is removed, to thereby expose the active layer 148.

Figure 13E:
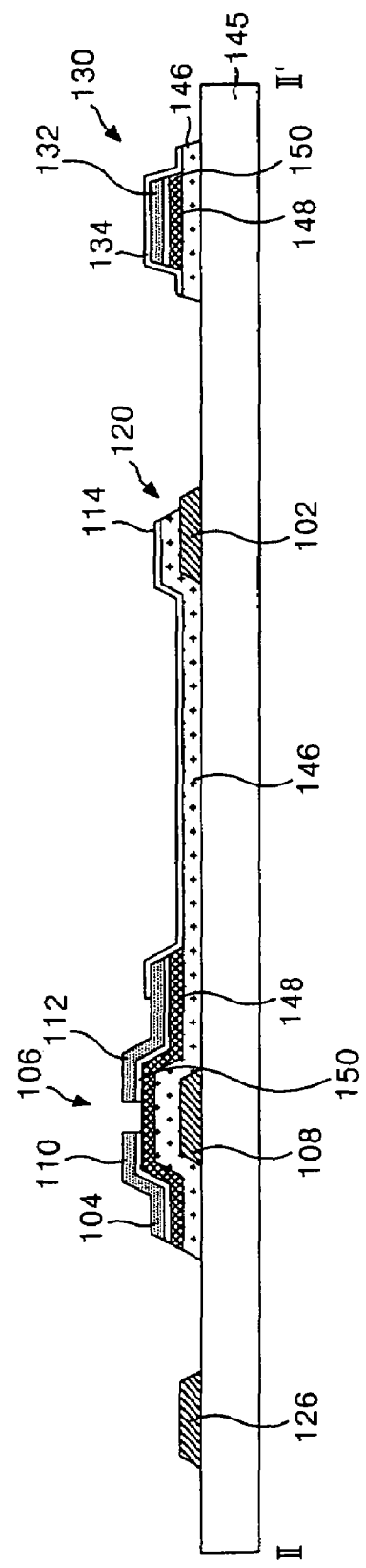

For example, when a thickness ratio of the ohmic contact layer 150 and the gate insulating film 143 is above about 1:8, an etching gas including sulfur hexafluoride $SF_6$ and oxygen $O_2$ having a ratio of about 1:3 may be injected into a vacuum chamber such that the ohmic contact layer 150 and the gate insulating film 143 may be dry-etched for a second period of time that may be shorter than the first period of time. Accordingly, as shown in FIG. 13D, the gate insulating film 143 may be patterned such that the gate insulating pattern 146 exposing the gate pad 126 may be formed, and the ohmic contact layer 150 may be partially etched to remain at the channel region of the TFT 106. Then, an etching gas including sulfur hexafluoride $SF_6$ and chlorine $Cl_2$ having a mixture ratio of about 1:10 may be injected into a vacuum chamber such that the ohmic contact layer 150 maybe dry-etched for a third period of time. Accordingly, as shown in FIG. 13E, the ohmic contact layer 150 may be entirely removed at the channel region of the TFT 106 such that the active layer 148 is exposed.

Otherwise, when a thickness ratio of the ohmic contact layer 150 and the gate insulating film 143 is above about 1:10, an etching gas including tetrafluorocarbon $CF_4$ and hydrogen $H_2$ having a mixture ratio of about 5:1 may be injected into a vacuum chamber such that the ohmic contact layer 150 and the gate insulating film 143 may be dry-etched for a second period time that may be shorter than the first period of time. Accordingly, as shown in FIG. 13D, the gate insulating film 143 may be patterned such that the gate insulating pattern 146 exposing the gate pad 126 may be formed, and a portion of the ohmic contact layer 150 may be partially etched at the channel region of the TFT 106. Then, an etching gas including sulfur hexafluoride $SF_6$ and chlorine $Cl_2$ having a mixture ratio of about 1:10 may be injected into the vacuum chamber such that the ohmic contact layer 150 may be dry-etched for a third period of time. Accordingly, as shown in FIG. 13E, the ohmic contact layer 150 may be entirely removed at the channel region of the TFT 106 such that the active layer 148 is exposed.

According to the present invention, the gate insulating film and the ohmic contact layer may be simultaneously dry-etched using the second and the third conductive pattern groups as a mask. Thus, the TFT array substrate may be fabricated using a three-round mask process, thereby simplify the fabrication processes, reducing manufacturing costs and improving manufacturing yields.

It will be apparent to those skilled in the art that various modifications and variations can be made in the thin film transistor array substrate and method of fabricating a thin film transistor array substrate of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor array substrate, comprising:

forming a first conductive pattern group including a gate line, a gate pad, and a gate electrode of a thin film transistor, the thin film transistor connected to the gate line on a substrate;

forming a gate insulating film on the substrate including the first conductive pattern group;

forming a second conductive pattern group including a data line crossing the gate line, a source electrode of the thin film transistor connected to the data line, and a drain electrode of the thin film transistor, an ohmic contact layer, and a semiconductor layer for forming a channel region of the thin film transistor;

forming a third conductive pattern group including a transparent electrode material connected to the drain electrode;

etching the ohmic contact layer using the source and drain electrodes as a first etch mask; and etching the gate insulating film using the second and the third conductive pattern groups as a second etch mask, wherein the etching of the ohmic contact layer and the etching of the gate insulating film are performed simultaneously.

2. The method according to claim 1, wherein the simultaneous etching of the gate insulating film and the ohmic contact layer includes:

dry-etching the gate insulating film to form the gate insulating pattern having an identical pattern to the second and the third conductive pattern groups between the first and the second conductive pattern groups; and dry-etching the ohmic contact layer of the thin film transistor to expose the channel region of the thin film transistor.

3. The method according to claim 1, wherein the simultaneous etching of the gate insulating film and the ohmic contact layer includes etching the ohmic contact layer and the gate insulating film having a thickness ratio of above about 1:8 by using an etching gas including sulfur hexafluoride $SF_6$ and oxygen $O_2$ having a mixture the ratio of about 1:3.

4. The method according to claim 3, further including the step of etching the ohmic contact layer using an etching gas including sulfur hexafluoride $SF_6$ and chlorine $Cl_2$ having a mixture ratio of about 1:10 to expose an active layer included in the semiconductor layer.

5. The method according to claim 1, wherein the simultaneous etching of the gate insulating film and the ohmic contact layer includes etching the ohmic contact layer and the gate insulating film having a thickness ratio of above about 1:10 by using an etching gas including tetrafluorocarbon $CF_4$ and hydrogen $H_2$ having a mixture ratio of about 5:1.

6. The method according to claim 5, further including the step of etching the ohmic contact layer using an etching gas including sulfur hexafluoride $SF_6$ and chlorine $Cl_2$ having a mixture ratio of about 1:10 to expose an active layer included in the semiconductor layer.

7. The method according to claim 1, wherein the simultaneous etching of the gate insulating film and the ohmic contact layer includes forming a data pad connected to the data line, the data pad including a lower data pad electrode.

8. The method according to claim 7, wherein the step of forming the data pad further includes forming an upper data pad electrode connected to the lower data pad electrode.

9. The method according to claim 8, wherein the upper data pad electrode includes the transparent electrode material.

10. The method according to claim 9, wherein the transparent electrode material contacts the gate insulating film underlying the data pad.

11. The method according to claim 8, wherein the gate insulating layer corresponds to a pattern of one of the lower data pad electrode and the upper data pad electrode.

12. The method according to claim 11, wherein sidewall portions of the gate insulating layer, the lower data pad electrode, the ohmic contact layer, and the upper data pad electrode are coincident.

13. The method according to claim 1, wherein the gate insulating layer extends from the gate electrode to overlap the gate line.

14. The method according to claim 13, wherein the transparent electrode material extends on the gate insulating film from the drain electrode of the thin film transistor to overlap the gate line.

15. The method according to claim 14, further comprising forming a storage capacitor including the gate line, the gate insulating layer overlapping the gate line, and the transparent electrode material overlapping with the gate line.

* * * * *